(12) United States Patent
How

(10) Patent No.: US 9,703,526 B2
(45) Date of Patent: Jul. 11, 2017

(54) SELF-STUFFING MULTI-CLOCK FIFO REQUIRING NO SYNCHRONIZERS

(71) Applicant: Altera Corporation, San Jose, CA (US)

(72) Inventor: Dana How, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/656,300

(22) Filed: Mar. 12, 2015

(65) Prior Publication Data

US 2016/0268005 A1 Sep. 15, 2016

(51) Int. Cl.
G06F 5/06 (2006.01)
G11C 19/28 (2006.01)
G06F 5/08 (2006.01)

(52) U.S. Cl.
CPC ............... *G06F 5/06* (2013.01); *G11C 19/28* (2013.01); *G11C 19/287* (2013.01); *G06F 5/08* (2013.01)

(58) Field of Classification Search
CPC ................................ G06F 5/06; G11C 19/287
USPC .......................................................... 365/211
See application file for complete search history.

(56) References Cited

U.S. PATENT DOCUMENTS

| 9,385,717 | B1 | 7/2016 | How | |
|---|---|---|---|---|
| 2002/0146023 | A1* | 10/2002 | Myers | H04L 47/10 370/412 |
| 2003/0172242 | A1* | 9/2003 | Uneyama | G06F 5/14 711/167 |
| 2004/0125665 | A1 | 7/2004 | Chelcea et al. | |
| 2008/0152064 | A1* | 6/2008 | Kitagawa | H04N 21/23608 375/371 |
| 2013/0205160 | A1* | 8/2013 | Turner | G06F 5/12 713/400 |
| 2014/0126572 | A1 | 5/2014 | Hutton et al. | |
| 2014/0181571 | A1* | 6/2014 | Kassoff | G06F 5/06 713/501 |

OTHER PUBLICATIONS

Singh et al., "MOUSETRAP: Ultra-High-Speed Transition-Signaling Asynchronous Pipelines", ICCD 2001, Sep. 2001, pp. 9-17.
European Search Report for patent application No. 16157069.2, European Patent Office, dated Jul. 25, 2016.

(Continued)

*Primary Examiner* — Richard Elms
*Assistant Examiner* — Jerome Leboeuf

(57) ABSTRACT

An asynchronous first in first out memory device eliminates the need for synchronizers. The device includes pipeline of data registers. The data registers include a first register to accept data writes of data and a last register data reads. Each register has an enable input to indicate a full condition allowing a read and an empty condition allowing a write. A bubble inserter circuit inserts a bubble in the first register to prevent a completely empty condition for all registers. Controllers are associated with each register to allow the bubble or written data to be passed from the first register to the last register. A near empty detect circuit is coupled to the registers to determine a nearly empty condition of the pipeline. An arbiter determines whether a data write proceeds or a bubble insertion proceeds for the first register when the plurality of registers is near empty.

20 Claims, 7 Drawing Sheets

(56) References Cited

OTHER PUBLICATIONS

M. Singh et al., "MOUSETRAP: High-Speed Transition-Signaling Asynchronous Pipelines", IEEE Transactions on VLSI Systems, vol. 15, No. 6, Jun. 2007, pp. 684-698.
Clifford E. Cummings, "Simulation and Synthesis Techniques for Asynchronous FIFO Design," Sunburst Design, Inc., SNUG San Jose 2002, pp. 1-23.
Clifford E. Cummings, "Simulation and Synthesis Techniques for Asynchronous FIFO Design with Asynchronous Pointer Comparisons," Sunburst Design, Inc., SNUG San Jose 2002, pp. 1-18.

* cited by examiner

SELF-STUFFING MULTI-CLOCK FIFO REQUIRING NO SYNCHRONIZERS

TECHNICAL FIELD

The present disclosure relates generally to data registers and more specifically to use of FIFO circuits for memory operations.

BACKGROUND

Use of (first in first out) FIFO memory registers in digital designs for buffering and flow control has been widespread for many years. The emergence of system on chip (SOC) and networks on chip (NOC) for internal connections have made it imperative to ensure correct flow of data across the chip or die. The various computing components in such networks are often synchronized on different clocks. Thus data transfer in such systems requires an asynchronous first in first out (FIFO) register to assist in transferring data between differently clocked components.

An asynchronous FIFO refers to a FIFO design where data values are written sequentially into a FIFO buffer using one clock domain, and the data values are sequentially read from the same FIFO buffer using another clock domain, where the two clock domains are asynchronous to each other. The first in first out (FIFO) buffer serves as a memory buffer between two asynchronous devices each with simultaneous write and read access to and from the FIFO. The accesses are independent of one another. Data written into a FIFO is sequentially read out in a pipelined manner. Thus the first data word written into a FIFO will be the first data word that is read out. The fundamental architecture of a FIFO has a write port, a read port, and memory locations. Each port has its own associated pointer that points to a location in memory. After a reset, both write and read pointers will be at the first memory location within the FIFO where the memory registers are empty. When the write address register again reaches the read address register, the FIFO registers are full. Every write operation will cause the write pointer to increment to the next address in memory thus filling registers, while every read operation will increment the read pointer to the next memory location as each register is emptied.

In order to synchronize read and write operations, a synchronizer circuit is used for the comparison of the addresses of the pointers. Such a comparison will determine whether the FIFO is empty or full and thus whether either read or write operations may be performed respectively. A synchronizer includes logic devices such as flip flops that compare the addresses of data on the read and write side. Such circuits trade off latency for reliability. Reliability requires more stages of flip flop circuits, but increases the latency of the synchronization since the address comparisons must flow through each flip flop stage. In a conventional FIFO, the status signals (or addresses from which they are generated) must pass through synchronizers before usage in the receiving clock domain. The stage count in these synchronizers determines their latency/reliability trade-off.

One common technique for designing an asynchronous FIFO is to use Gray code pointers that are synchronized into the opposite clock domain before generating synchronous FIFO full or empty status signals. One Gray code counter style uses a single set of flip-flops as the Gray code register. While transferring pointer information between independent clock domains in an asynchronous FIFO, each bit, new or old of the pointer, needs to be sent. If more than one bit in the multi-bit pointer is changing at the sampling point, an incorrect binary value can be propagated. By guaranteeing that only one bit can be changing, Gray codes guarantee that the only possible sampled values are the new or old multi-bit value, ensuring reliable flag information indicating whether the read and write registers are full or empty.

This design requires a multi-bit synchronizer in each port, to make the other port's address register usable. This synchronizer is large, since many bits need to be simultaneously synchronized, and these bits may need to be converted to and from Gray code in order for the synchronization to be well-behaved. This synchronizer also sits in a fixed location in the design, resulting in a fixed latency/reliability tradeoff. This tradeoff is a consequence of the fact that the more time a synchronizer has, the more latency it injects into the surrounding system, and the more reliable is its operation.

SUMMARY

One example is a first in first out (FIFO) memory device that includes an extra bit for each register in a pipeline to indicate the insertion of a bubble thereby preventing the FIFO from ever being in a completely empty state and eliminating the need for synchronization circuitry. The FIFO memory device includes a pipeline of registers that include a first register accepting data from a write device at a first clock speed and a last register that allows a device to read data at a second different clock speed. The FIFO memory device has a near empty detect circuit that will cause a bubble inserter circuit to insert a bubble in the first register and set a flag in the extra bit indicating a bubble. This requires no synchronization between the read and write devices since if the clock speeds for the read devices are faster, the read can always be performed since the registers will never be empty with the bubbles. The read operation is not performed for registers having the bit indicating a bubble. Since the FIFO is never empty, no synchronization is required, thereby reducing latency required by synchronization circuits in known FIFO registers.

Additional aspects will be apparent to those of ordinary skill in the art in view of the detailed description of various embodiments, which is made with reference to the drawings, a brief description of which is provided below.

BRIEF DESCRIPTION OF THE DRAWINGS

The foregoing and other advantages will become apparent upon reading the following detailed description and upon reference to the drawings.

Figure 1:
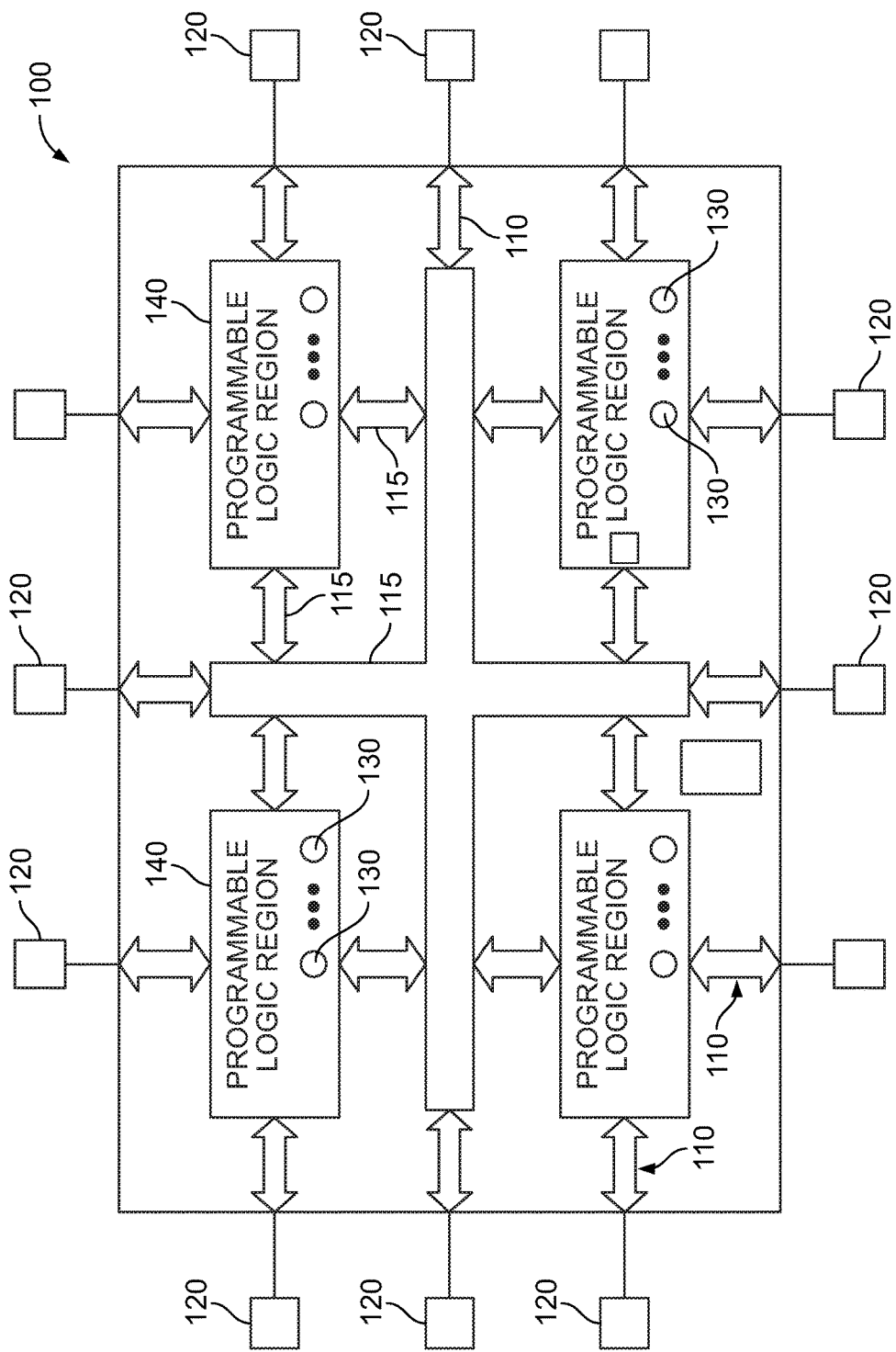
FIG. 1 is a block diagram of a processing system on a die.

While the invention is susceptible to various modifications and alternative forms, specific examples have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

An illustrative example of a computing system that includes data exchange in an integrated circuit component die is a programmable logic device (PLD) 100 in accordance with an embodiment is shown in FIG. 1. The programmable logic device 100 has input/output circuitry 110 for driving signals off of device 100 and for receiving signals from other devices via input/output pins 120. Interconnection resources 115 such as global and local vertical and horizontal conductive lines and buses may be used to route signals on device 100.

Input/output circuitry 110 includes conventional input/output circuitry, serial data transceiver circuitry, differential receiver and transmitter circuitry, or other circuitry used to connect one integrated circuit to another integrated circuit.

Interconnection resources 115 include conductive lines and programmable connections between respective conductive lines and are therefore sometimes referred to as programmable interconnects 115.

Programmable logic region 140 may include programmable components such as digital signal processing circuitry, storage circuitry, arithmetic circuitry, or other combinational and sequential logic circuitry such as configurable register circuitry. As an example, the configurable register circuitry may operate as a conventional register. Alternatively, the configurable register circuitry may operate as a register with error detection and error correction capabilities.

The programmable logic region 140 may be configured to perform a custom logic function. The programmable logic region 140 may also include specialized blocks that perform a given application and have limited configurability. For example, the programmable logic region 140 may include specialized blocks such as configurable storage blocks, configurable processing blocks, programmable phase-locked loop circuitry, programmable delay-locked loop circuitry, or other specialized blocks with possibly limited configurability. The programmable interconnects 115 may also be considered to be a type of programmable logic region 140.

Programmable logic device 100 contains programmable memory elements 130. Memory elements 130 can be loaded with configuration data (also called programming data) using pins 120 and input/output circuitry 110. Once loaded, the memory elements each provide a corresponding static control signal that controls the operation of an associated logic component in programmable logic region 140. In a typical scenario, the outputs of the loaded memory elements 130 are applied to the gates of metal-oxide-semiconductor transistors in programmable logic region 140 to turn certain transistors on or off and thereby configure the logic in programmable logic region 140 and routing paths. Programmable logic circuit elements that may be controlled in this way include parts of multiplexers (e.g., multiplexers used for forming routing paths in programmable interconnects 115), look-up tables, logic arrays, AND, OR, NAND, and NOR logic gates, pass gates, etc.

Memory elements 130 may use any suitable volatile and/or non-volatile memory structures such as random-access-memory (RAM) cells, fuses, antifuses, programmable read-only-memory memory cells, mask-programmed and laser-programmed structures, combinations of these structures, etc. Because memory elements 130 are loaded with configuration data during programming, memory elements 130 are sometimes referred to as configuration memory, configuration RAM (CRAM), or programmable memory elements.

The circuitry of device 100 may be organized using any suitable architecture. As an example, the logic of programmable logic device 100 may be organized in a series of rows and columns of larger programmable logic regions each of which contains multiple smaller logic regions. The smaller regions may be, for example, regions of logic that are sometimes referred to as logic elements (LEs), each containing a look-up table, one or more registers, and programmable multiplexer circuitry. The smaller regions may also be, for example, regions of logic that are sometimes referred to as adaptive logic modules (ALMs), configurable logic blocks (CLBs), slice, half-slice, etc. Each adaptive logic module may include a pair of adders, a pair of associated registers and a look-up table or other block of shared combinational logic (i.e., resources from a pair of LEs—sometimes referred to as adaptive logic elements or ALEs in this context). The larger regions may be, for example, logic array blocks (LABs) or logic clusters of regions of logic containing for example multiple logic elements or multiple ALMs.

During device programming, configuration data is loaded into device 100 that configures the programmable logic regions 140 so that their logic resources perform desired logic functions. For example, the configuration data may configure a portion of the configurable register circuitry to operate as a conventional register. If desired, the configuration data may configure some of the configurable register circuitry to operate as a register with error detection and error correction capabilities.

Frequently a FIFO memory device is inserted simply to compensate for an unknown phase relationship between a sending device and a receiver device in systems with multiple devices exchanging data such as the PLD 100 in FIG. 1. Another common case is a source-synchronous link where sender and receiver device clocks ultimately derive from the same clock source but with an unknown phase in each case. A simpler FIFO memory device without synchronization circuits may be used in this case.

Figure 2:
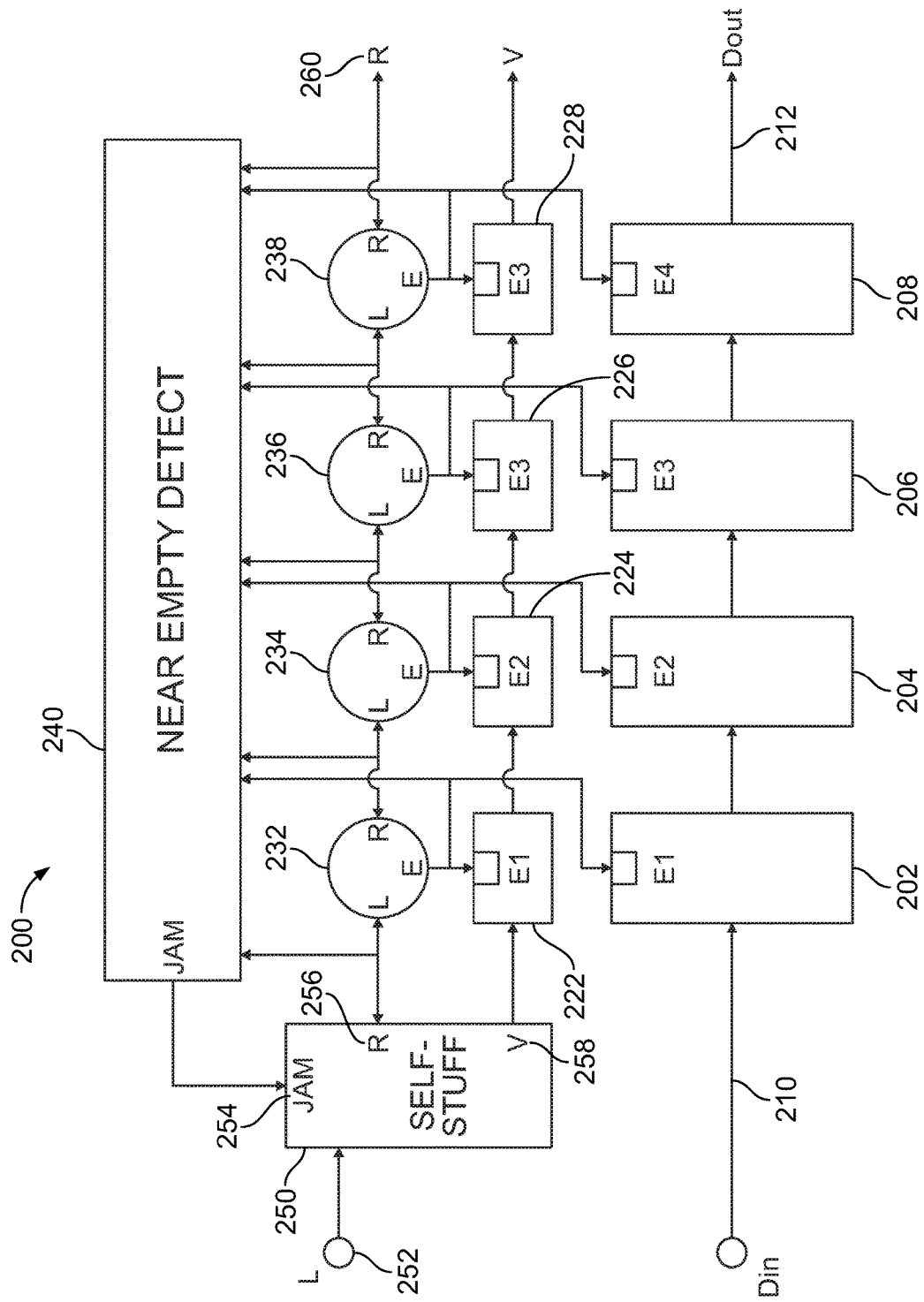
FIG. 2 is a block diagram of an example self-stuffing asynchronous FIFO memory device used on the processing system die in FIG. 1.

FIG. 2 is a block diagram of a pipeline-based self-stuffing FIFO memory device 200 augmented with self-stuffing circuitry to insert bubbles and thereby eliminate the need for synchronization circuits. A bubble is a set of dummy values that substitute for actual data such as the data stored in the respective register from a previous write that has already been read. The FIFO 200 includes a series of registers 202, 204, 206, and 208, which are arranged in a pipeline to pass data written to the first register 202 by a write device to the second register 204 and in sequence to the last register 208 for reads by a read device. In this example, write or transmitter devices that are clocked from a first clock write to the first memory register 202 while other read or receiver devices that are clocked from a second different clock read from the last register 208. The registers 202 and 208 are accessed by a data input bus 210 and a data output bus 212 respectively.

Each of the registers 202, 204, 206, and 208 has an associated one bit latch 222, 224, 226, and 228. As will be explained below, the one bit latches 222, 224, 226, and 228 indicate whether a bubble has been inserted in the particular associated register. Although there are four registers in this example, it is to be understood that there can be any number of registers in the FIFO 200. Each of the registers 202, 204, 206, and 208 and their associated one bit latches 222, 224, 226, and 228 are controlled by a corresponding latch controller circuit 232, 234, 236, and 238. Each of the latch controller circuits such as the latch controller circuit 232 has an enable output E, a receiver port L and a transmitter port R. As shown in FIG. 2, signals may be passed from the transmitter port R of one controller such as the controller 232 to the receiver port L of the next controller 234 when writes are performed in sequence for each corresponding register in the pipeline. Correspondingly, when reads are performed, signals may be passed from the receiver port L of one controller such as the controller 238 to the transmitter port R of the next controller 236 in the pipeline. The latch controller for each register and one bit latch receives read and write requests and controls whether the corresponding register and one bit latch is enabled (respective inputs E1-E4 on registers 202, 204, 206, and 208 and latches 222, 224, 226, and 228) thereby allowing data to be written or not enabled, indicating the register has stored data to be read. Specifically, when a register such as the register 208 has been read, its controller such as the controller 238 then changes its enable input (E4) to allow data from either the write device or the previous register to be written.

A near empty detect circuit 240 is coupled to the enable outputs of the latch controllers 232, 234, 236, and 238 in this example. A self-stuffing circuit or bubble inserter circuit 250 is coupled to the first one bit latch 222 and first latch controller 232. The FIFO 200 in this example operates assuming that the clock regulating the devices writing data into the first register 202 of the FIFO 200 operate at the same or lower speed as the clock regulating the devices reading the data and thus the FIFO 200 might become empty. To compensate for this possibility, the bubble inserter circuit 250 may insert "bubbles" in the first register 202, which is pipelined to the other registers 204, 206, and 208, as needed if the FIFO 200 falls too far below half-full and thereby avoids the use of synchronization circuits to detect a completely physically empty condition in the FIFO 200.

As shown in FIG. 2, the near empty detect circuit 240 has inputs for each of the enable state signals for the registers 202, 204, 206, and 208 that are controlled from the latch controllers 232, 234, 236, and 238. The bubble inserter circuit 250 includes a write handshake connection 252 and a jam input 254. The bubble inserter 250 includes a write handshake connection 256 and a bubble flag output 258. The write enable handshake connection 256 outputs a signal that is coupled to receiver L port of each of the latch controllers 232, 234, 236, and 238 in succession and thus enables the corresponding registers 202, 204, 206, and 208 to receive data to be written from the data input bus 210 and be pipelined through the registers 202, 204, 206, and 208 by each of the successive controllers 232, 234, 236, and 238 outputting an enable signal over the E outputs to the enable inputs E1-E4. The signal from the receiver L port causes each successive controller to send the signal through the transmitter R port to the receiver L port of the next controller. The controllers 232, 234, 236, and 238 also enable the corresponding one bit latches 222, 224, 226, and 228 to write the zero to indicate the presence of a bubble. The bubble flag output 258 is coupled to the first one bit latch 222. As explained below, the bubble flag output 258 stores a zero in the enabled one bit latch 222 to indicate the presence of a bubble stored in the respective register 202. As the bubble is propagated through the pipeline of registers 204, 206 and 208, the zero is passed to each successive one bit latch 224, 226, and 228, respectively, to indicate the presence of the bubble. Reading the last register 208 is accomplished from the output data bus 212 and is triggered by a read handshake connection 260. A successful read causes data in each proceeding register to be written into the next register in the pipeline. In the case of a bubble, the zero in the last one bit latch 228 will indicate a bubble and therefore the read device does not read the bubble from the last register 208.

The basic set of registers 202, 204, 206, and 208 in FIG. 2 has a very desirable property that if the entirety of registers are initialized to be half-full (e.g., every other register stage contains data), and its endpoint clocks have the same frequency, then it will never become empty or full and the reads and writes will never need to be synchronized since a read or write can always occur in the registers 202, 204, 206, and 208. This is true even if the endpoint clocks have an unknown (but still fixed) phase relationship.

In operation of the FIFO memory device 200 in FIG. 2, the clock of the write device is always at the same or lower rate than the clock of the read device. In this manner, there will never be a situation where data is overwritten in registers that have not been read. If a write request signal is received from the write handshake connection 252, the bubble inserter 250 will send a write enable signal over the write handshake connection 256. The latch controller 232 will enable the register 202 to accept data from the data input bus 210 by sending an enable high signal to the register 202 to enable input E1. In this case, since a real data word is written, the bubble flag output 258 sets the latch 222 high to indicate that real data is now stored in the register 202.

In the case of a read request, a downstream consumer asserts the read signal on the read handshake connection 260 low to the transmitter R port of the rightmost latch controller 238. The read signal is held low and sent to each of the successive latch controllers 236, 234, and 232 in succession from the receiver L port of the controller to the transmitter R port of the next controller. On receiving the read signal, the respective latch controllers, 238, 236, 234, and 232 cause a low enable signal to be sent to the respective registers 208, 206, 204 and 202. Since the enable signal is low for the register 208 from the latch controller 238, the data in the register 208 may be read and output on the data output bus 212. After the data is read from the register 208, the read handshake connection 260 returns high and the enable signal is set high for the register 208 by the rightmost latch controller 238, which allows data to be written from the register 206 to the register 208. This process repeats for each preceding register thereby moving data or bubbles through the pipeline of registers 202, 204, 206, and 208. The first register 202 therefore will eventually be physically empty (having neither data nor a bubble) at the end of the process. If the latch 228 is set low for the last register 208, a bubble is stored in the register 208 and the read device will receive no valid data. However, the process will continue to pipeline other data through the registers 202, 204, 206, and 208 to result in an empty first register 202.

The near empty detect circuit 240 detects whether there is a near empty condition, which is defined as having less than two of the registers 202, 204, 206, and 208 full. This detection occurs to prevent a situation where all of the registers 202, 204, 206, and 208 are empty. The near empty detect circuit 240 will detect such a near empty situation and send a jam output signal to the jam input 254 of the bubble inserter 250. The bubble inserter 250 will "insert" a bubble into the first register 202 and set the bubble flag in the latch 222 low to indicate that a bubble is stored in the first register 202. The bubble is simply a dummy data value in lieu of actual data that will be ignored by the read device and therefore simply uses whatever values are in the register 202 as the "insert" of the bubble. The bubble is thus added to the sequence of data moving through the registers and is written to the register 204 in sequence as data is moved through the pipeline of registers 202, 204, 206, and 208. The bubble functions to prevent an empty situation and therefore eliminates the need to synchronize the read operation with the write operation. As the bubble is passed through the pipeline of registers 202, 204, 206, and 208, the bubble flag is passed through to the respective latches 222, 224, 226, and 228.

Figure 3A:
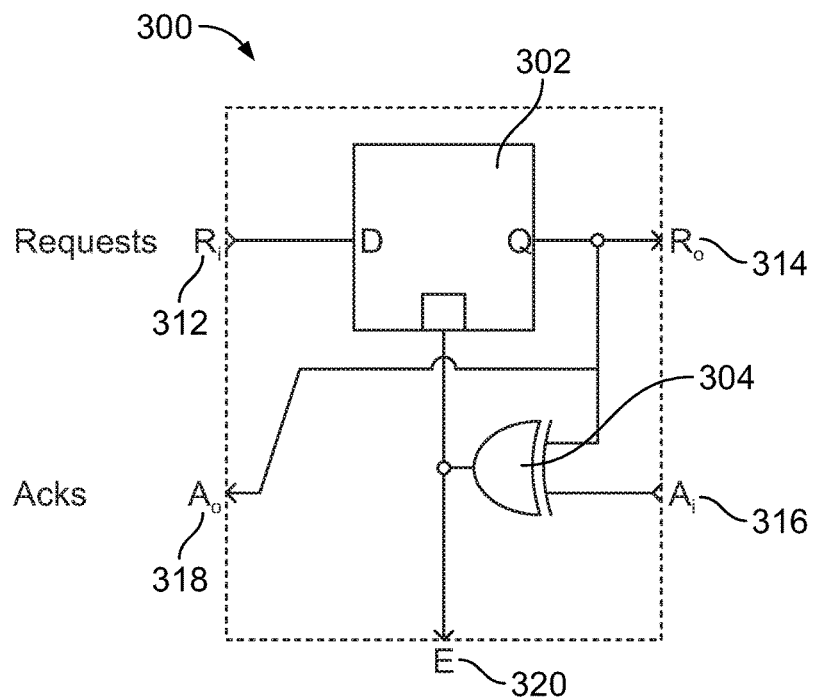
FIG. 3A is a block diagram of an example simple controller suitable for controlling the registers in the self-stuffing FIFO memory device in FIG. 2.

FIG. 3A is a circuit diagram of a transition-signaling-based version of a latch controller circuit 300, which may be used for the latch controller circuit 232 in FIG. 2 to control writing of data to the register 204 from the corresponding register 202. The latch controller circuit 300 includes a D-latch 302 and an exclusive OR gate 304. The latch controller circuit 300 includes a request input 312 and a request output 314. The latch controller circuit 300 has an acknowledge input 316 and a corresponding acknowledge output 318. An enable output 320 is coupled to the respective register to send an enable signal to allow the data in the register to be written to. This enable output is level-sensitive and active-high, but all other inputs and outputs use transition-signaling. With transition-signaling, an event is indicated by the signal changing value, but the value itself doesn't matter.

When a request transition is received for a write operation on the register on the request input 312, the request is passed along via the D-latch 302 to the request output 314, which passes the request along to the next controller. The request output 314 also alters one of the inputs of the XOR gate 304. The output of the XOR gate 304 will thus fall from high to low and clear the enable signal of the corresponding register via the enable output 320 to direct the register to latch the waiting data. The output of the XOR gate 304 is also connected to the enable input of the D-latch 302 and the fall of the output of the XOR gate 304 will disconnect the output of the D-latch 302 from the D input, until the controlled register's contents are later read out.

The output of the D-latch 302 also is sent back over the acknowledge output 318 to indicate that the write request has been received. When the request transition is received by the last latch controller 238, an acknowledge signal is sent to the acknowledge input 316, which is connected to the other input of the XOR gate 304 and the enable output 320 is set high to enable a write to the register, since the next register has acknowledged absorbing its contents, and to allow the register to be newly written to. The D-latch 302 is made transparent by the high output of the XOR gate 304. The latch controller circuit 300 in FIG. 3A suffers from extra latency as it requires all signals to be passed through the XOR gate 304 and the latch subcircuits.

Figure 3B:
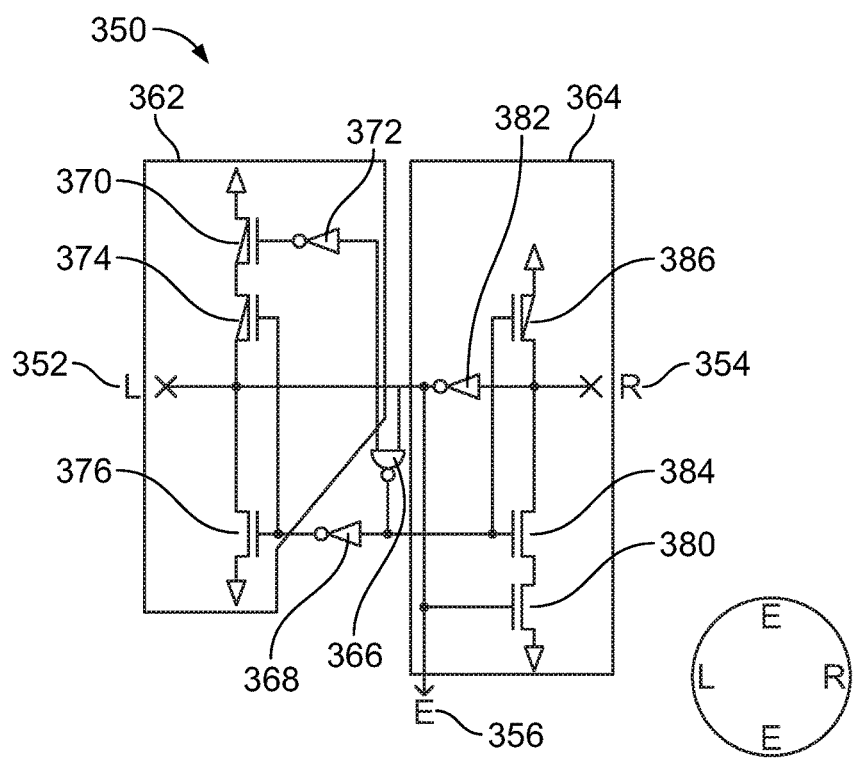
FIG. 3B is a block diagram of an example controller having a single line input and output for controlling the registers of the self-stuffing FIFO memory device in FIG. 2.

FIG. 3B is a circuit diagram of another example of a latch controller circuit 350 such as the latch controller circuit 232 in FIG. 2. The controller in FIG. 3A uses transition-signaling, but FIG. 3B uses level-sensitive pulse-signaling, also called four-phase signaling, but it does so over a shared wire so the same number of transitions is needed. The controller in FIG. 3B also has less latency since it uses simpler components, and is therefore implemented in the memory device 200 in FIG. 2. With reference to FIG. 2, the latch controller 350 includes a receiver pin 352 (L) and a transmitter pin 354 (R). The receiver pin 352 is coupled to the write enable output 256 from the bubble inserter circuit 250 in FIG. 2 assuming the controller 350 is the first controller 232 for the leftmost register 202 in FIG. 2, while the transmitter pin 354 (R) is coupled to the receiver pin L of the next latch controller 234 in sequence. The latch controller circuit 350 includes an enable output 356 (E) that is coupled to both the enable input of corresponding register and one bit latch and an input of the near empty detect circuit 240 in FIG. 2.

The latch controller 350 is a single-wire level-sensitive design henceforth to be indicated by the circle symbol representing the latch controller 232 shown in FIG. 2. The latch controller 350 includes an input receiver/converter circuit 362 (on the left of FIG. 3B) and an output converter/transmitter 364 (on the right of FIG. 3B). The inputs to a NAND gate 366 are the signals from the receiver and transmitter inputs 352 and 354. The NAND gate 366 has one output coupled to an inverter 368. The NAND gate 366 and inverter 368 constitute a coordination/synchronization circuit between the receiver and transmitter circuits 362 and 364.

The input receiver circuit 362 includes a PFET 370 that has a gate coupled to the input signal from the receiver input pin 352 through an inverter 372. The PFET 370 and the inverter 372 form the cycle in a half-latch circuit that holds the left receiver input 352 high. The receiver/converter circuit 362 includes a PFET 374 that is in series with the PFET 370 and has a gate coupled to the inverted output of the NAND gate 366. An NFET 376 is coupled in series with the PFET 374 and has a gate coupled to the output of the inverter 368. Thus, the PFET 374 functions as a tri-state control that disconnects the half latch when the NFET 376 is conducting, which avoids contention. The left receiver pin 352 is held in the low state by the half-latch in the previous latch controller to the left of the latch controller 350 if the latch controller 350 is one of the intermediate latch controllers such as the latch controller 234 in FIG. 2.

The right output half 364 includes an NFET 380 having a gate coupled to the right transmitter pin 354 through an inverter 382. The NFET 380 and inverter 382 form the cycle in the half latch holding the right transmitter pin 354 low. An NFET 384 is coupled in series with the NFET 380 and has a gate coupled to the output of the NAND gate 366. The NFET 384 functions as a tri-state control, which disconnects the half latch circuit when the output driver through the transmitter pin 354 is conducting via the PFET 386, thereby avoiding contention. The right transmitter pin 354 is held in the high state by the half-latch in the next latch controller to the right of the latch controller 350. The PFET 386 is coupled in series with the NFET 384 and is controlled by the output of the NAND gate 366, which is coupled to the gate of the PFET 386. The enable output 356 is the inverted state of the right transmitter pin 354 as it is the output of the inverter 382.

In this example, the latch controller 350 is used for the latch controllers in FIG. 2 such as the latch controller 232.

Thus, each pair of right-going request signals and left-going acknowledge signals are replaced by a single bidirectional wire in the form of the receiver pin (L) 352 and the transmitter pin (R) 354. The controller circuit 350 in FIG. 3B includes the receiver/converter 362, the converter/transmitter 364, and the coordination/synchronization circuitry (NAND gate 366 and inverter 368) in between the converters 362 and 364. The "converter" refers to the conversion between a single bidirectional wire and a pair of unidirectional wires.

When a write request is sent by the bubble inserter circuit 250, the high signal is received in the receiver pin 352. The high input signal is inverted by the inverter 372 and turns on the PFET 370. This is the half-latch on the receiver side holding the input signal high as long as required and until disconnected. The high signal is also input to one of the inputs of the NAND gate 366, which will produce a low signal when the other input coupled to the transmitter pin 354 through the inverter 382 is or later becomes low. The low signal from the NAND gate 366 is inverted by the inverter 368 and turns off the PFET 374, disconnected the half-latch from the receiver pin 352. When a read request is received from the transmitter pin 354, the output of the NAND gate 366 turns low. The low output from the NAND gate 366 is inverted by the inverter 368 and turns on the NFET 376. The NFET 376 thus pulls the receiver pin 352 low. This functions as a "self-reset" of the request on receiver pin 352, as well as an acknowledgment to the upstream circuit doing the write.

The low output from the NAND gate 366 also turns off the NFET 380, disconnecting the half latch formed by inverter 382 and NFET 380, which (depending on its state) may be holding the transmitter pin 354 low, and turns on the PFET 386. The now high signal at pin 354 is inverted by the inverter 382 and provides a low signal to NAND gate 366. The inverted signal from the inverter 382 also is the output enable signal from the enable output 356, which enables the corresponding register to accept a read.

A high state on the transmitter pin 354 indicates that there is data in the register to be read. The signal is inverted by the inverter 382, which causes a low input to be sent to the NAND gate 366. The inverted signal from the inverter 382 also sets the enable output 356 low and prevents any writing to the register. This low value causes the output of the NAND gate 366 to be high, which turns on the NFET 384, reconnecting the half latch on the transmitter pin 354 to maintain its current high level, and turns off the PFET 386, which previously pulled the transmitter pin 354 high to indicate new data in this state. This prepares the circuit for a subsequent read request to read the data now in the stage.

Figure 4A:
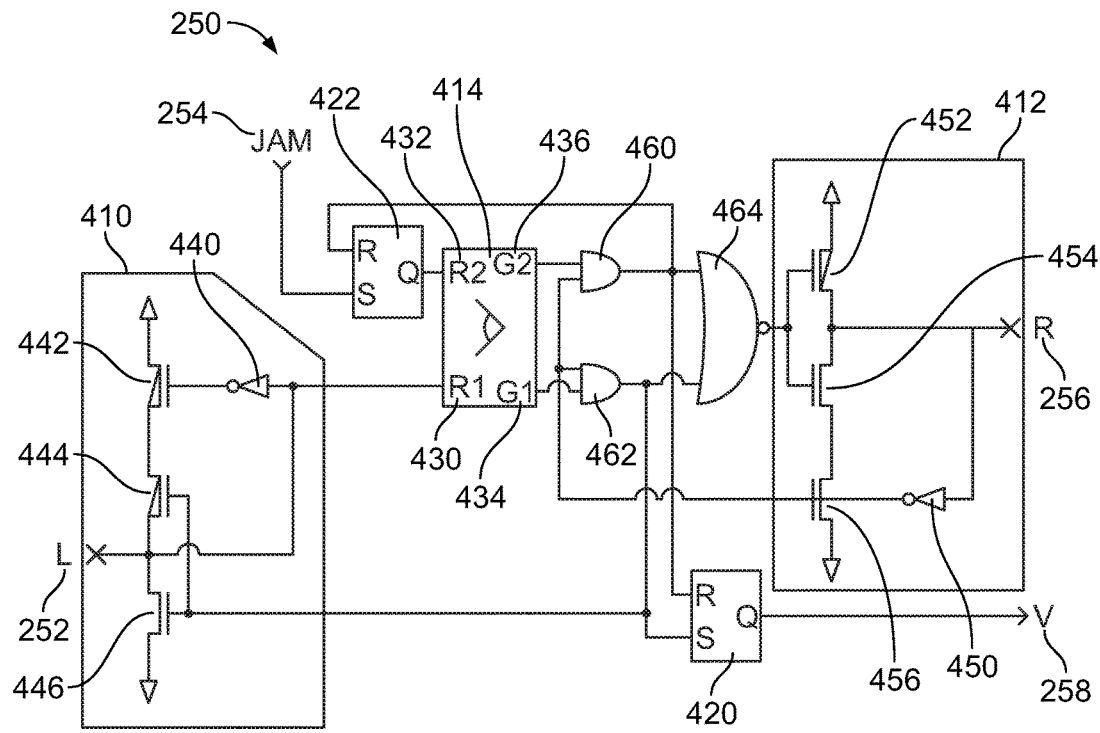
FIG. 4A is a block diagram of an example bubble inserter circuit in the self-stuffing FIFO memory device in FIG. 2.

FIG. 4A is a circuit diagram of an example bubble inserter circuit 250 in FIG. 2. The bubble inserter circuit 250, shown in FIG. 4A, includes a single-wire receiver/converter 410, a single-wire converter/transmitter 412, and an arbiter 414 between the receiver 410 and transmitter 412. A latch 420 is coupled to the arbiter 414 to hold the results of the arbitration. An input latch 422 holds the value of the jam input signal from the jam input 254.

Similar to the latch controller 350 in FIG. 3B, the receiver/converter 410 reads the signal from the write handshake connection 252. The signal is fed into an inverter 440, which is coupled to a PFET 442. The PFET 442 is wired in series with a PFET 444 and an NFET 446. The PFET 442 and PFET 444 form a half latch to hold the write handshake connection 252 high. The NFET 446 allows the reset of the write handshake connection 252 when the write has occurred.

The converter/transmitter 412 includes an inverter 450 having an input coupled to the write handshake connection 256. A PFET 452 is wired in series with an NFET 454 and another NFET 456. The PFET 452 and the NFET 454 are controlled by a NOR gate 464. The NFET 456 is part of the half latch also built from the inverter 450. The gate of the NFET 456 is coupled to the output of the inverter 450. The half latch holds the write handshake connection 256 low after the downstream stage pulls it low to acknowledge receipt of the data read.

The arbiter 414 includes a first input 430 that reflects a write request and a second input 432 that reflects a jam request. The arbiter 414 includes a first output 434 that grants a write request from the write handshake connection 252 in FIG. 2 and a second output 436 that grants the jam request from the jam input 254. The arbiter 414 decides which request wins, assuming a jam request and a write request are received simultaneously. In this example, the arbiter 414 has unbounded computation time to determine whether to write new data or insert a bubble. The outputs 434 and 436 are each coupled to one input of a pair of AND gates 460 and 462. The outputs of the AND gates 460 and 462 are coupled to the NOR gate 464, which has an output coupled to the gates of the PFET 452 and the NFET 454.

As explained above, when new conventional data is received to be written into the FIFO 200, the write handshake connection 252 is set high, while when a bubble is required the jam input 254 is set high by the near empty detect circuit 240 in FIG. 2. When a write request is received, the signal is sent to the input 430 of the arbiter 414 and a high signal is output from the output 434. When the write request is received first, a subsequent jam request on the jam input 254 is initially ignored and held in the latch 422 connected to the second input 432 until the first input 430 receives a low signal. The high signal from the output 434 is input to the AND gate 462. The second input of the AND gate 462 is the inverted signal of the write handshake connection 256. The write handshake connection is low and thus a high signal is output from the AND gate 462, which causes a low output from the NOR gate 464. The low output from the NOR gate 464 turns off the NFET 454 and turns on the PFET 452 thus pulling the write handshake connection 256 high, which is passed to the latch controller 232. The output of the AND gate 462 is also coupled to the S input of the latch 420, which outputs a high signal on the bubble flag output 258 and causes the bubble bit flag output to be high, which is stored in the latch 222 and therefore indicates that the register 202 has real data. The output of the AND gate 462 is also coupled to the gates of the NFET 446 and the PFET 444, which pull the write handshake connection 252 low to acknowledge the write.

After the write handshake connection 256 goes high, the output is inverted by the inverter 450, which turns the input to the AND gate 462 low thereby causing the output of the NOR gate to go high, turning on the NFET 454, turning off the PFET 452 and turning on the NFET 456 via the inverter 450, thus allowing the write handshake connection 256 to be pulled low when the downstream logic acknowledges reading the data just written.

If a near empty condition of the pipeline of registers 202, 204, 206, and 208 is detected by the near empty detection circuit 240, the jam input 254 is set high, which is input to the S input of the latch 422 and output as a high signal to the input 432 of the arbiter 414. The arbiter 414 causes the second output 436 to be high. When the jam request is received, any subsequent write signal is ignored and the arbiter 414 holds the first output 434 low until the second input 432 returns to low. The second output 436 is coupled to one input of the AND gate 460. The other input of the AND gate 460 is coupled to the write handshake connection 256, which is low and is inverted by the inverter 450 to cause a high signal to be input to the AND gate 460. The output of the AND gate 460 is therefore high and is coupled to the NOR gate 464, which outputs a low signal. The low output from the NOR gate 464 turns off the NFET 454 and turns on the PFET 452 thus pulling the write handshake connection 256 high, which is passed to the latch controller 232. The output of the AND gate 460 is also coupled to the R input of the latch 420 and causes the bubble bit flag output to be low reflecting the low output of the AND gate 462, which is output over the bubble flag output 258 and stored in the latch 222 in FIG. 2 indicating that the register 202 has stored a bubble. Similar to the write operation, the write handshake connection 256 will be pulled low again by the downstream circuit acknowledging reading the bubble just written and the bubble inserter 250 is ready for the next action.

Since new data may arrive for writing from the sending devices on the left of the FIFO 200 in FIG. 2 at any time, the arbiter 414 is required to decide if the pipeline will insert a new data word or a bubble into the register 202, since these two events are asynchronous with respect to each other. If both a write request and a jam request occur simultaneously, the arbiter 414 decides which request should be performed first and suspends the other request until the first request is completed.

As explained above, since the inputs of the AND gates 460 and 462 are coupled to the inverter 450, which inverts the signal from the write handshake connection 256, the AND gates 460 and 462 prevent the arbitration decision from propagating right until the transmitter 412 is ready to send an event through the write handshake connection 256. The outputs of the AND gates 460 and 462 and the NOR gate 464 produce a request to the pipeline of registers and controllers in the FIFO 200 to accept a new entry through the signal output over the write enable output 256. The RS latch 420 remembers the result of the arbitration, and its output is sent to the bubble flag output 258 to set the extra bit stored in the latch 222 representing whether real data or a bubble is written into the first register 202. As explained above, if new data is written to the first register 202, the output of the RS latch 420 is set to a one and sent through the bubble flag output 258 to set the latch 222 as a one. If a bubble is inserted, the output of the RS latch 420 is set to low and sent through the V output 258 to set the bubble flag as a low.

Figure 4B:
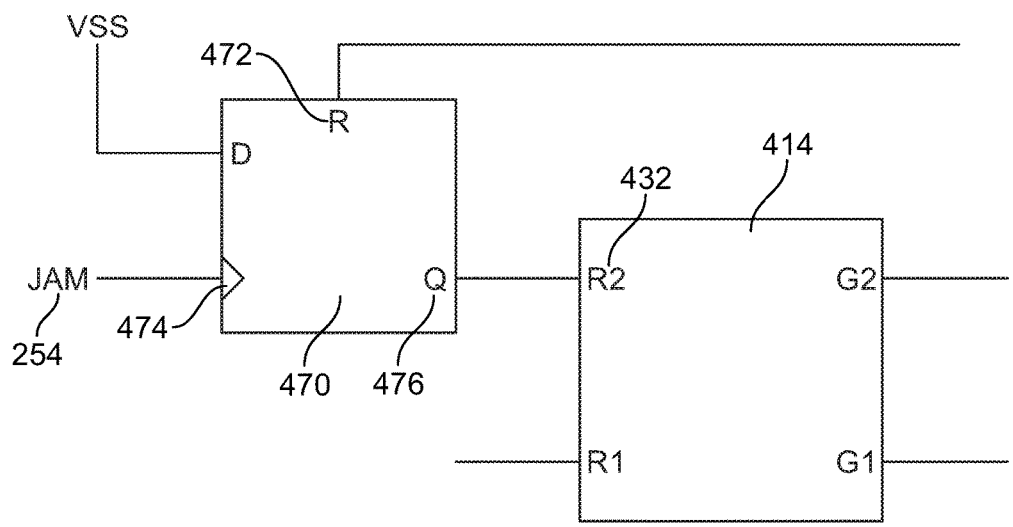
FIG. 4B is a variation of the bubble inserter circuit in FIG. 4A using a D-latch.

FIG. 4B shows an alternate hold circuit for the RS type latch 422 of the bubble inserter circuit 250 in FIG. 4A. The latch 422 in FIG. 4A is replaced by a D flip flop 470 shown in FIG. 4B. As shown in FIG. 4B, the jam input 254 is connected to the clock input 474. The reset input 472 of the D latch 470 is coupled to the output of the AND gate 460 in FIG. 4A. The D input is tied high, while the Q pin 476 is coupled to the second input 432 of the arbitration circuit 414.

The circuit that includes the RS latch 422 in FIG. 4A behaves properly only if the "jam" signal is removed quickly. The circuit using the D latch 470 shown in FIG. 4B responds only to the rising edge of the signal on the jam signal input 254 and doesn't care when it is removed. The circuit with the D latch 470 thus can tolerate a wider range of circuit possibilities for the near empty detect circuit 240, which generates the "jam" signal.

Figure 5:
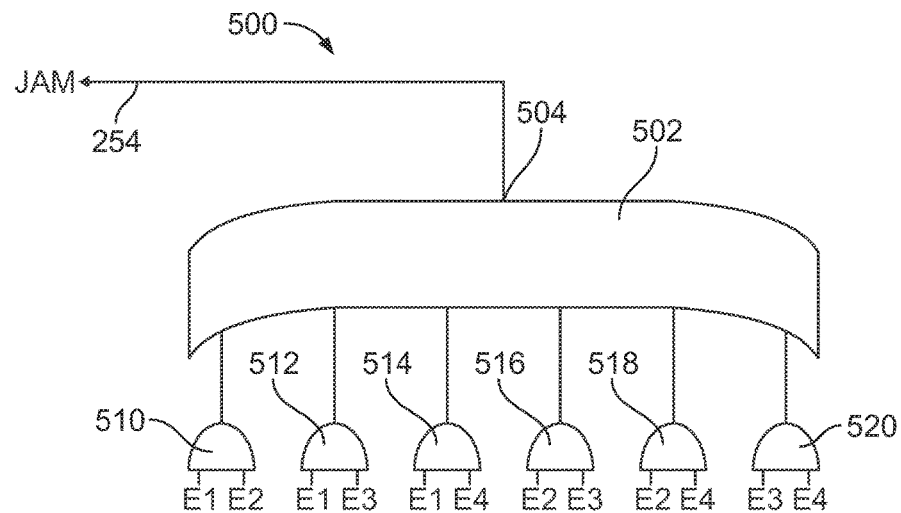
FIG. 5 is a block diagram of an example near empty detection circuit in the self-stuffing FIFO memory device in FIG. 2.

FIG. 5 shows an example of the near empty detect circuit 500 such as the near empty detect circuit 240 in FIG. 2. The near-empty-detect circuit 240 may be implemented in a number of ways. It could directly monitor the state of the latch enables generated by the latch controllers such as the latch controller 232 in FIG. 2. In order to tolerate wide variations in pulse timing, it should check for the near-empty condition by checking that at least two latch enables of the registers are asserted, as shown in the example near empty detect circuit 500 in FIG. 5. The near empty detect circuit 500 includes an OR gate 502 that has an output 504 that is coupled to the jam input 254 in FIG. 2. The inputs of the OR gate 502 are coupled to the outputs of respective AND gates 510, 512, 514, 516, 518, and 520. The AND gates all have inputs that are coupled to the enable outputs from the controllers 232, 234, 236, and 238 to the enable inputs E1-E4 of the respective registers 202, 204, 206, and 208 in FIG. 2. For example, the AND gate 510 has a first input coupled to the enable input E1 of the register 202 and a second input coupled to the enable input E2 of the register 204. Thus, each of the AND gates 510, 512, 514, 516, 518, and 520 have a unique set of two of the enable inputs E1-E4 from the registers 202, 204, 206, and 208. If no two latch enables are asserted, indicating that at least two of the registers are empty, the output of the OR gate 502 sends a high signal to the jam input 254 to trigger the insertion of a bubble as explained above.

Another more general and robust technique would be to count the transitions on the latch controller handshaking pulses just before and after data is written to the pipeline of registers and if the difference between these two counts is in a certain range the pipeline registers are near-empty. Thus, the near empty detect circuit 240 in FIG. 2 includes inputs from the lines between the latch controllers 232, 234, 236, and 238. Another variation of the near empty detect circuit 240 is programmable in order to select between different latencies and arbiter reliabilities.

The latency and reliability of the entire FIFO 200 can be altered by changing the near-empty-detect circuit 240. If near empty detect circuit 240 requests a new bubble whenever the pipeline occupancy falls below two, for example, then that means any new arriving data will have at least two items in the pipeline before it, possibly all bubbles, and thus the latency of this data through the pipeline cannot be less than two. This also means that the arbiter 414 in the bubble inserter circuit 250 always has two clock cycles to make its decision (since it takes that many clock cycles to empty the pipeline), which is important since the decision could be delayed if the arbiter 414 internally enters metastability and this requires a certain amount of time to resolve.

Figure 6:
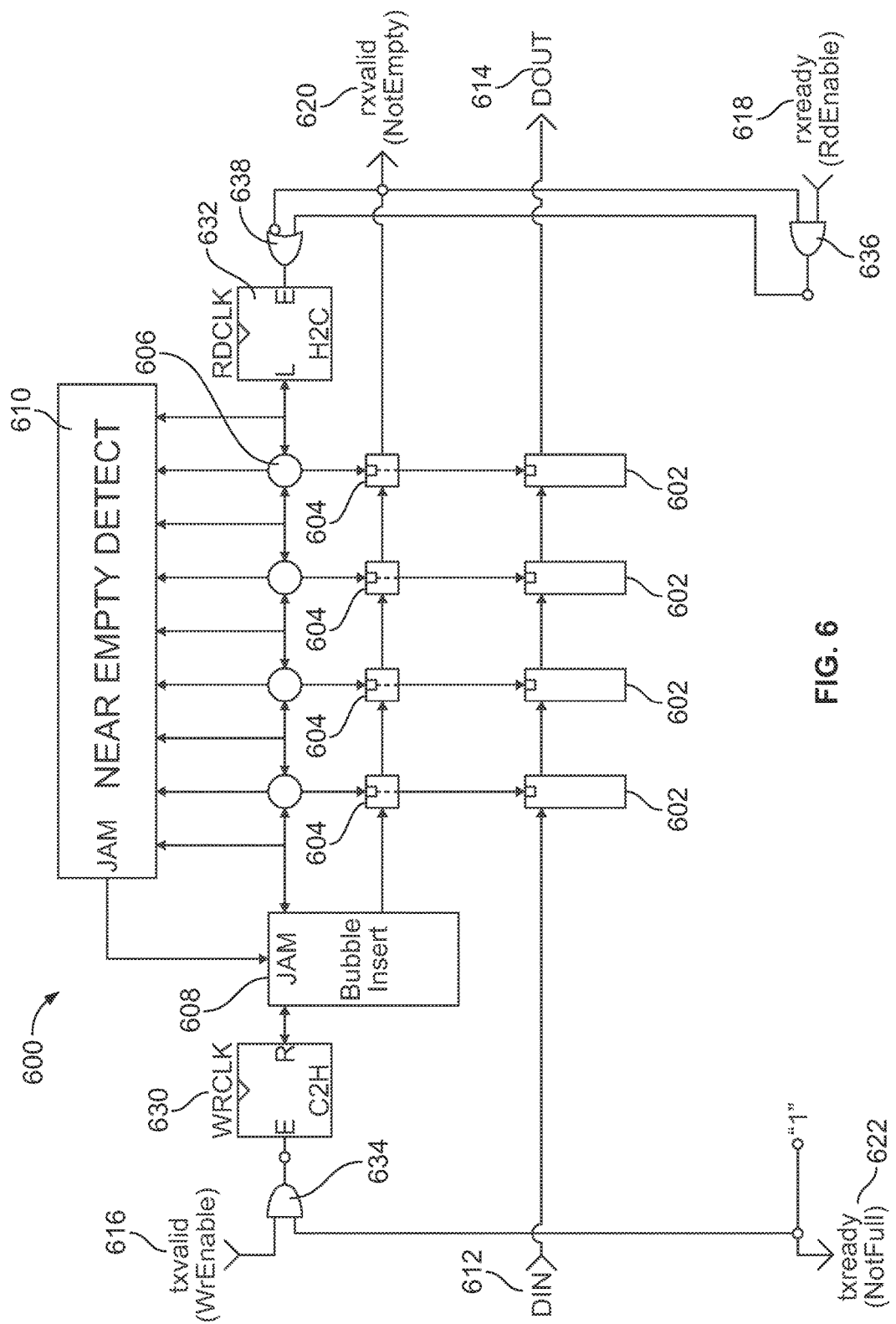
FIG. 6 is another example of a self-stuffing FIFO memory device having protocol converters.

FIG. 6 is an example of a FIFO memory device 600 that uses protocol converters and gating circuitry to ensure that reads are not enabled unless the register pipeline is not completely empty. In the FIFO 600, the clock rate of the write devices is slower than the clock rate of the read devices, and thus there may be an empty condition in the pipeline of registers without the bubble inserter circuitry. Similar to the FIFO 200 in FIG. 2, the FIFO 600 includes a series of registers 602 in a pipeline, bubble bit latches 604, and latch controllers 606. The FIFO 600 includes a bubble insert circuit 608 and a near empty detect circuit 610. Data is written into the registers 602 from an input databus 612 and read from the registers from an output databus 614. A write is initiated from a write request input 616 and reads are initiated from a read request input 618. A not empty condition for the registers 602 is indicated by a read valid output 620. A not full condition is indicated by a write valid output 622 that is permanently tied high.

A first protocol converter 630 is connected to the bubble insert circuit 608. Another protocol converter 632 is connected to the read enable input 618. When a write request is received on the write enable input 616, the signal is sent to the input of an AND gate 634. The other input of the AND gate 634 is coupled to the write ready output 622 that is tied high at all times. The write signal is sent to the protocol converter 630, which is clocked the same as the devices writing to the FIFO 600. The protocol converter 630 sends the high signal to the bubble insert circuit 608 to initiate the write to the first register 602 when the register is enabled. The near empty detect circuit 610 may send a jam signal to the bubble insert circuit 608 indicating the registers 602 are almost empty resulting in the insertion of a bubble in order to keep the registers 602 from being empty.

Similarly, when a read is requested, a signal is sent to the read enable input 618. The signal is input to one input of an AND gate 636. The other input of the AND gate 636 is coupled to the read valid output 620, which will be high when the registers 602 are not entirely empty thereby allowing a read to occur. The output of the AND gate 636 is coupled to one input of an OR gate 638. The other input of the OR gate 638 is inverted from the read valid output 620. The output of the OR gate 638 sends a high signal to the enable input of the protocol converter 632 exactly when a read is requested and valid, or there is a bubble in the register pipeline. The protocol converter 632 is clocked by the same clock for devices reading from the FIFO 600. The protocol converter 632 will output a signal to the last latch controller 606 to request a read of the last register 602 in the pipeline.

Figures 7A, 7B:
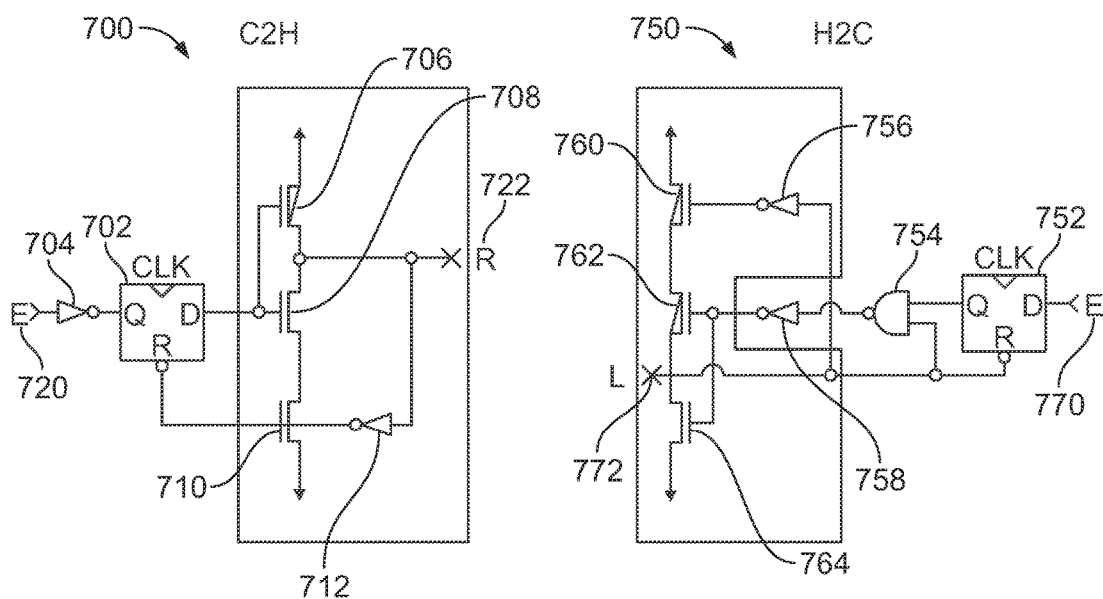
FIGS. 7A and 7B are example protocol converters used in the FIFO memory device in FIG. 6.

FIG. 7A shows an example clocked protocol to handshake protocol converter 700 that converts clocked signals to the handshaking protocol such as the protocol converter 630 in FIG. 6. The protocol converter 700 includes a D-flip-flop 702 having an input coupled to an inverter 704. The output of the flip-flop is coupled to a half latch converter transmitter circuit exactly the same as that shown in the right of FIG. 3B. The output of the flip-flop 702 is coupled to the gates of a PFET 706 and an NFET 708. The PFET 706 and the NFET 708 are wired in series with an NFET 710. The gate of the NFET 710 is coupled to an inverter 712. An enable input 720 takes a high signal clocked by the writing device. The high signal is inverted by the inverter 704 and output as a low signal from the D flip-flop 702. The low is sent to the gates of the PFET 706 and NFET 708 to pull write handshake connection 722 high. The write handshake connection 722 provides a connection point using the handshaking protocol of the written to devices to the right of FIG. 7A. The write handshake connection 722 is inverted by the inverter 712 producing a low signal to the set input to remove the low signal in the D flip-flop 702.

FIG. 7B shows an example handshake protocol to clocked protocol converter 750 that converts handshaking signals to clocked signals such as the protocol converter 632 in FIG. 6. The converter 750 includes a D flip-flop 752, which feeds the Q output to one input of a NAND gate 754. The handshake signal is coupled to an inverter 756, which is coupled to the gate of the PFET 760. The output of the NAND gate 754 is inverted by an inverter 758, which has an output coupled to the gates of a PFET 762 and an NFET 764. The PFET 762 is wired in series to a PFET 760. As shown in FIGS. 7A and 7B, the protocol converters 700 and 750 contain the converter/transmitter and receiver/converter sub-blocks exactly the same as the blocks 364 and 362, respectively, in the controller 350 in FIG. 3B.

When a signal is received by an input 770 such as to enable a read such as that for the protocol converter 632 in FIG. 6, the high signal is input to the flip-flop 752. The resulting high output of the flip-flop 752 is coupled to the NAND gate 754, which results in a low output, which is inverted by the inverter 758 and turns the PFET 762 off and the NFET 764 on. This pulls the handshake connection 772 low to indicate to the upstream circuit that the read request has absorbed the read data.

When the handshake connection 772 goes high, the other input of the NAND gate 754 goes high and thereby pulls the handshake connection 772 low again. The output of the handshake connection 772 is also coupled to the inverter 756, which inverts the high signal and turns on the PFET 760, in order to retain the high signal in this half latch configuration. This pulls the handshake connection 772 low to indicate to the upstream circuit that the read request has absorbed the read data.

Figure 8:
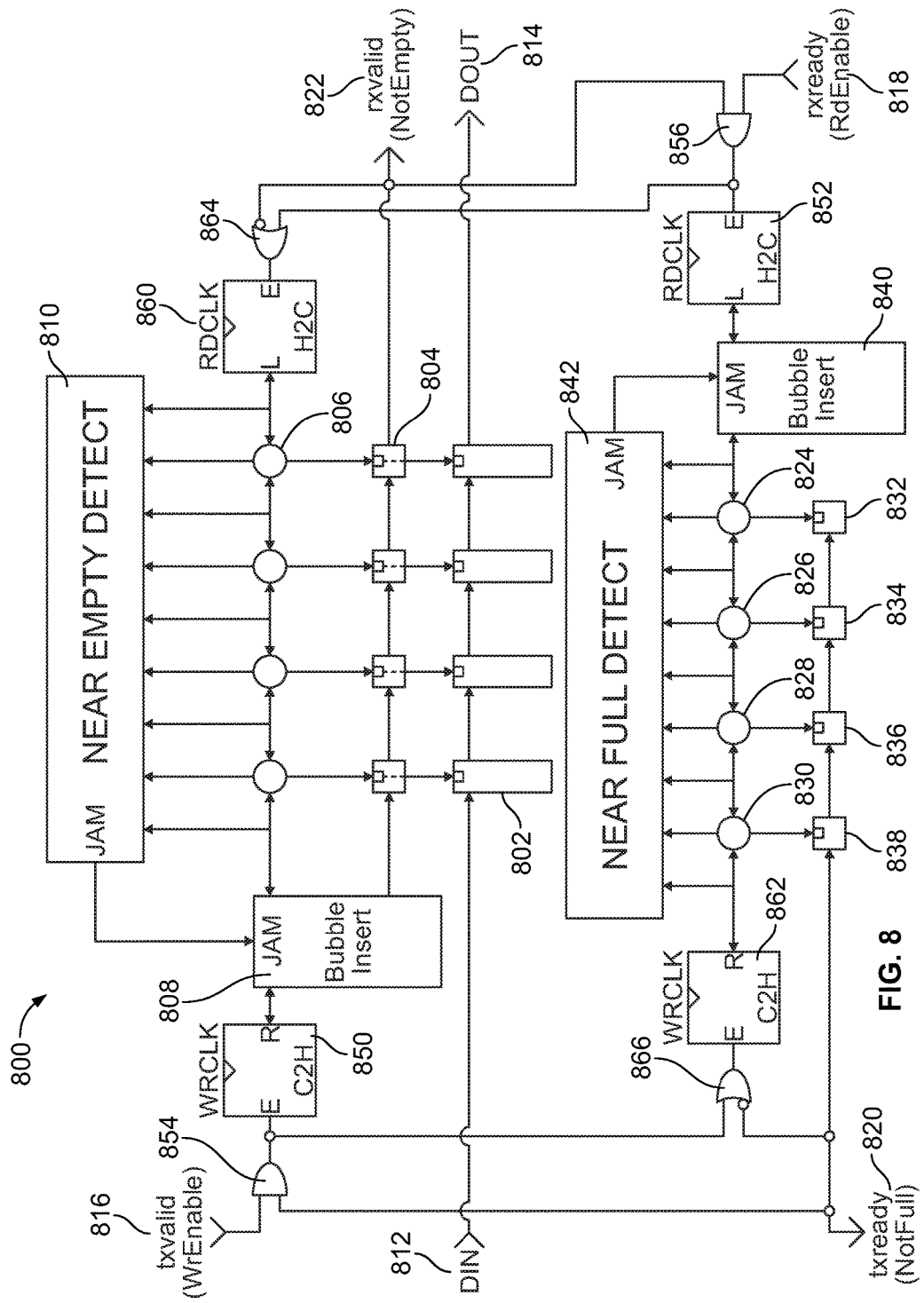
FIG. 8 is an example self-stuffing FIFO memory device that allows different clock speeds for both sender and receiver by a separate read credit system.

FIG. 8 shows an example of a self-stuffing pipeline-based FIFO memory device 800 with empty and full arbitration. The memory device 800 operates similarly to the memory device 600 shown in FIG. 6 except a backwards-flowing credit path has been added. In the FIFO 800, the clock rates for the devices requesting reads and writes of data may be at different rates. Thus, if the rate of the clock for the writing devices is faster, there may be a full state of the register pipeline but if the clock rate of the reading devices is faster as above there may be an empty state. The need to synchronize the FIFO 800 regardless of the different read and write clock speeds is eliminated by adding a reverse path using the same technique of bubble insertion and arbitration described above. Similar to the FIFO memory device 200 in FIG. 2, the FIFO memory device 800 includes a series of registers 802, bubble bit latches 804, and latch controllers 806. The FIFO 800 includes a bubble inserter circuit 808 and a near empty detect circuit 810. Data is written into the registers 802 from an input data bus 812 and read from the registers from an output data bus 814. Data writes to the first register 802 is initiated from a request signal on a write enable input 816 and data reads from the last register 802 are initiated from a request signal to a read enable input 818. A write ready output 820 indicates that the pipeline is not full and thus a write may be initiated. A read ready output 822 indicates that the pipeline is not completely empty and a read may be initiated.

In the FIFO 800, a secondary, reversed sequence of latch controllers 824, 826, 828, and 830 has been added, which indicate the granting of a "credit to transmit" to the write devices by the data receiver. The latch controllers 824, 826, 828, and 830 are connected to and enable a pipeline of one bit credit latches 832, 834, 836, and 838. A bubble inserter 840 is coupled to a near full detect circuit 842. The bubble inserter 840 inserts a credit in the first latch 832 when the registers 802 are nearly full. The credit is inserted whenever one of registers 802 becomes newly empty in order to prevent the registers 802 from being completely full. The credit is thus pipelined down the latches 832, 834, 836, and 838 to the last one bit latch 838. The one bit credit latches each convey credit data in the opposite direction of the registers 802, and with surrounding circuitry interpreting a second FIFO of the one bit credit latches 832, 834, 836, and 838 as containing credits, and uses them to prevent over-run in the registers 802. Similar to the bubble inserter explained above, the bubble inserter 840 includes an arbiter to arbitrate between when the near full detect circuit 842 indicates a bubble needs to be inserted occurs simultaneously with a read request from the read enable input 818.

The controllers 824, 826, 828, and 830 do not need to control latches, since the presence of a credit or bubble is all that is required. After the arbitration in the bubble inserter 840, however, it is necessary to know if the pipeline contains real credits or bubble credits, so the single bit latches 832, 834, 836, and 838 along the bottom, which store that indicator, need to be controlled. Just as the forward data-path is widened to include a bit for the bubble flag, the reverse credit-path is widened from zero width to a one-bit pipeline of one bit latches 832, 834, 836, and 838. The bits in the reverse credit-path allow the avoidance of a completely full condition of the registers 802 in the pipeline and thereby obviate the need for a synchronizer.

The FIFO 800 also includes two protocol converters 850 and 852 that convert signals from a device clock to handshaking signals for the controller and bubble inserter circuitry. The first protocol converter 850 is coupled to the bubble inserter circuit 808 and includes an input that is coupled to an output of an AND gate 854. The inputs of the AND gate 854 are coupled to the write enable input 816 and the write ready output 820, which will be explained below.

The second protocol converter 852 is coupled from the output of the bubble insert circuit 840. The input of the protocol converter 852 is coupled to the output of an AND gate 856. The first input of the AND gate 856 is coupled to the read enable line 818 and the other input is coupled to the read ready output 822.

The FIFO 800 also includes two protocol converters 860 and 862 that convert read and write requests, respectively, to handshaking signals for the controllers and the bubble inserter circuitry. The first protocol converter 860 is coupled to the R pin of the last controller 806. The input of the protocol converter 860 is coupled to the output of an OR gate 864. The inputs of the OR gate 864 are coupled to the transmission/read valid (not empty) input 822 and the output of the AND gate 856. Thus, a read request through the read enable input 818 will not be initiated until the pipeline is not empty as indicated by the read valid input 822 from the last bubble flag latch 804.

The other protocol converter 862 has an output coupled to the latch controller 830. The input of the protocol converter 862 is coupled to the output of an OR gate 866. The inputs of the OR gate 866 are the transmit ready input 820 and the output of the AND gate 854. Thus, a write request through the write enable input 816 will not be initiated until the pipeline is not full as indicated by the write valid input 820 from the last credit flag latch 838.

The FIFO 800 allows arbitration of full pipeline situations that prevent a write to the registers 802. If a read enable is received on the read enable input 818, it is coupled to the input of the AND gate 856. The other input of the AND gate 856 is coupled to the output of the last latch 804, which will only allow the output signal of the AND gate 856 to go high when the last register has real data to be read and thus the bubble flag stored in the last latch 804 is a one. The read enable signal thus is fed into the protocol converter 852, which conveys the enable signal to the bubble inserter circuit 840, which indicates that a credit has occurred. As shown in FIG. 8, the protocol converter 852 is clocked at the same rate as the devices making the read request. The bubble inserter circuit 840 converts the enable request into a credit signal for the latch 832. The output of the AND gate 856 also is coupled to one input of the OR gate 864. The other input of the OR gate 864 is coupled to the bubble flag value of the last latch 804. The output of the OR gate 864 is coupled to the enable input of the protocol converter 860. The protocol converter 860 is clocked at the same rate as the devices that make the read request. The protocol converter 860 sends an acknowledge signal to the chain of latch controllers 806 and eventually to the bubble inserter circuit 808. In this manner, the read enable signal is converted to the timing of the registers and only sent when there is not an empty condition in the registers 802.

Similarly, when a write request is received on the write request input 816, the signal is connected to one of the inputs of the AND gate 854. The other input of the AND gate 854 is coupled to the write ready output 820, which is the value of the last one bit latch 838. If the value of the latch 832 is high, it indicates that the corresponding register is empty and ready to be written to. The output of the AND gate 854 is coupled to the enable input of the protocol converter 850, which is clocked at the rate of the devices requesting writes. The output of the protocol converter 850 is coupled to the write handshaking connection of the bubble inserter circuit 808, which initiates the writing of data from the data input bus 812.

The handshaking-based FIFO 800 in FIG. 8 includes core conversion circuitry to convert between the handshaking-based signaling in the core and conventional synchronous clocking in the write and read interfaces. This conversion circuitry includes four protocol converters 850, 852, 860, and 862 and four qualifying gates 854, 856, 864, and 866. As explained above, the pipeline of latches 832, 834, 836, and 838 in combination with the near full detector 842 will insert the appropriate numbers of real credits and bubble credits, which will prevent the additional writes that would make the registers 802 entirely full.

While the present principles have been described with reference to one or more particular examples, those skilled in the art will recognize that many changes can be made thereto without departing from the spirit and scope of the disclosure. Each of these examples and obvious variations thereof is contemplated as falling within the spirit and scope of the disclosure, which is set forth in the following claims.

What is claimed is:

1. An asynchronous first in first out memory device comprising:
   a plurality of data registers arranged in a pipeline, the plurality of data registers including a first register to accept writing of data from a write device and a last register to allow reading of data by a read device, each register having an enable input to indicate a full condition allowing a read of the register and an empty condition allowing a write to the register, the plurality of data registers allowing data to be passed in sequence from the first register to the last register;
   a bubble inserter circuit to cause a bubble that is a dummy data value instead of actual data to be stored in the first register to prevent a completely empty condition for all of the data registers;
   a latch to store a bit received from the bubble inserter circuit that indicates whether the first register is storing the bubble or the actual data;
   a near empty detect circuit coupled to the plurality of data registers to determine a nearly empty condition of the plurality of data registers; and
   wherein the bubble inserter circuit includes an arbiter, the arbiter determining whether a data write proceeds or a bubble insertion proceeds for the first register when the plurality of data registers is near empty as determined by the near empty detect circuit.

2. The memory device of claim 1, further comprising a plurality of controllers, each associated to a respective register of the plurality of registers via the enable input, the plurality of controllers allowing the bubble or written data to be passed from the first register to the last register.

3. The memory device of claim 2, wherein the controllers each include half latch circuitry to hold a request signal and an acknowledgement circuit to send an acknowledge output signal in one clock cycle.

4. The memory device of claim 1, wherein the clock rate of the write device is the same or lower than the clock rate of the read device.

5. The memory device of claim 1, wherein the bubble inserter circuit sets an indication that the first register is storing a bubble by changing the bit stored in the latch, and wherein the bit is passed in sequence with the bubble from the latch to additional latches, and wherein the read device ignores the contents of the last register in response to a read request, if the last register contains a bubble.

6. The memory device of claim 1, wherein the near-empty-detect circuit is programmable in order to select between different latencies and arbiter reliabilities.

7. The memory device of claim 1, further comprising:
a credit pipeline including a plurality of credit latches, the credit pipeline including a first latch corresponding to the last register and a last latch corresponding to the first register, wherein a credit is written to the first latch when a read is made from the last register;
a second bubble inserter coupled to the first credit latch;
a nearly full detect circuit coupled to the plurality of credit latches, the nearly full detect circuit inserting a bubble credit into the first credit latch when the credit latches are nearly empty; and
wherein the clock rate of the read device is at a slower clock rate than the write device.

8. A method of using a first in first out memory device having a plurality of registers arranged in a pipeline including a first register to accept a data write from a write device and a last register to allow a data read by a read device, each register having an empty condition and a full condition, the method comprising:
determining whether the plurality of registers are in a near empty state;
causing a bubble of replacement dummy values instead of actual data to be stored in the first register to avoid an empty state in the plurality of registers;
setting a bubble bit associated with the first register to indicate that a bubble is stored in the first register;
pipelining the bubble and bubble bit to the next register of the plurality of registers in response to a read request until the bubble reaches the last register;
receiving a read request to read data in the last register;
reading the bubble bit associated with the last register; and
ignoring the contents of the last register in response to the read request if the last register contains a bubble.

9. The method of claim 8, further comprising:
receiving a write request;
determining whether the write request and determination of a near empty state occurs simultaneously;
arbitrating between the write request and the insertion of a bubble;
writing data to the first register if the arbitration proceeds with the write request; and
delaying the writing of the data to the first register until the bubble is inserted if the arbitration proceeds with the bubble insertion.

10. The method of claim 8, wherein the clock rate of the write device is the same or lower than the clock rate of the read device.

11. The method of claim 9, wherein the arbitration has unbounded computation time to determine whether to write the data or insert a bubble.

12. The method of claim 8, wherein a plurality of bubble bits each corresponding to one of the plurality of registers is provided, and wherein an indication is made that the first register is storing a bubble by changing the bubble bit.

13. The method of claim 8, wherein the near empty condition is programmable in order to select between different latencies.

14. The method of claim 9, wherein the near empty condition is programmable in order to select between different reliabilities of the arbitrating.

15. The method of claim 8, further comprising:
writing a credit in to the first register of a plurality of credit latches when a read is made from the last register, wherein the plurality of credit latches are in a pipeline including a first credit latch corresponding to the last register and a last latch corresponding to the first register;
inserting a bubble credit into the first credit latch when the credit latches are nearly empty; and
wherein the clock rate of the read device is at a slower clock rate than the write device.

16. A computational system comprising:
a write device being clocked at a first clock rate;
a read device being clocked at a second clock rate; and
an asynchronous first in first out memory device coupled to the write device and the read device, the memory device including:
a plurality of data registers arranged in a pipeline, the plurality of data registers including a first register to accept writing of data from the write device and a last register to allow reading of data by the read device, each register having an enable input to indicate a full condition allowing a read of the register and an empty condition allowing a write to the register, the plurality of data registers allowing data to be passed in sequence from the first register to the last register;
a bubble inserter circuit to cause a bubble that is a dummy data value instead of actual data to be stored in the first register to prevent a completely empty condition for all of the data registers;
a near empty detect circuit coupled to the plurality of data registers to determine a nearly empty condition of the plurality of data registers; and
a latch to store a bit received from the bubble inserter circuit that indicates whether the first register is storing the bubble or the actual data,
wherein the bubble inserter circuit includes an arbiter, the arbiter determining whether a data write proceeds or a bubble insertion proceeds for the first register when the plurality of data registers is near empty as determined by the near empty detect circuit.

17. The computational system of claim 16, wherein the asynchronous first in first out memory device further comprises:
a plurality of controllers, each associated to a respective data register of the plurality of data registers via the enable input, the plurality of controllers allowing the bubble or written data to be passed from the first register to the last register,
wherein the controllers each include half latch circuitry to hold a request signal and an acknowledgement circuit to send an acknowledge output signal in one clock cycle.

18. The computational system of claim 16, wherein the arbiter has unbounded computation time to determine whether to write new data or insert the bubble.

19. The computational system of claim 16, wherein the bubble inserter circuit sets an indication that the first register is storing a bubble by changing the bit stored in the latch, and wherein the bit is passed in sequence with the bubble from the latch to additional latches, and wherein the read device ignores the contents of the last register in response to a read request, if the last register contains a bubble.

20. An asynchronous first in first out memory device comprising:
a plurality of data registers arranged in a pipeline, the plurality of data registers including a first register to accept writing of data from a write device and a last register to allow reading of data by a read device, each register having an enable input to indicate a full condition allowing a read of the register and an empty condition allowing a write to the register, the plurality of data registers allowing data to be passed in sequence from the first register to the last register;
a bubble inserter circuit to cause a bubble that is a dummy data value instead of actual data to be stored in the first register to prevent a completely empty condition for all of the data registers;
a near empty detect circuit coupled to the plurality of data registers to determine a nearly empty condition of the plurality of data registers; and
wherein the bubble inserter circuit includes an arbiter, the arbiter determining whether a data write proceeds or a bubble insertion proceeds for the first register when the plurality of data registers is near empty as determined by the near empty detect circuit, and
wherein the arbiter has unbounded computation time to determine whether to write new data or insert the bubble.

* * * * *